US006493205B2

(12) United States Patent
Bauer

(10) Patent No.: US 6,493,205 B2
(45) Date of Patent: Dec. 10, 2002

(54) PROCESS FOR POLARIZING A FERROELECTRIC MATERIAL IN THE SHAPE OF A CYLINDER

(75) Inventor: Francois Bauer, Saint-Louis (FR)

(73) Assignee: Institute Franco-Allemand de Recherches de Saint-Louis, Saint-Louis (FR)

( * ) Notice: Subject to any disclaimer, the term of this patent is extended or adjusted under 35 U.S.C. 154(b) by 49 days.

(21) Appl. No.: 09/777,719

(22) Filed: Apr. 25, 2001

(65) Prior Publication Data

US 2002/0064015 A1 May 30, 2002

(30) Foreign Application Priority Data

Feb. 9, 2000 (FR) .......................................... 00 01596

(51) Int. Cl.$^7$ .............................................. H01T 23/00
(52) U.S. Cl. ...................................... 361/245; 361/233
(58) Field of Search .................. 361/143, 225, 361/226, 230, 233, 235, 245, 146, 147, 149; 29/25.35

(56) References Cited

U.S. PATENT DOCUMENTS 4,611,260 A    9/1986  Bauer
4,684,337 A *  8/1987  Bauer ........................ 425/135
6,198,225 B1 * 3/2001  Kano et al. ............... 315/169.3

FOREIGN PATENT DOCUMENTS

| DE | 3833493 | 4/1990 |
|----|---------|--------|
| EP | 146272  | 6/1985 |
| EP | 186534  | 7/1986 |

* cited by examiner

Primary Examiner—Matthew Nguyen
(74) Attorney, Agent, or Firm—Dennison, Schultz & Dougherty

(57) ABSTRACT

Process for polarizing at least a part of a ferroelectric material in a cylindrical shape having a longitudinal axis, and having an internal conductor inside the cylinder disposed along the longitudinal axis. At least part of said cylinder is placed in a conductive liquid with the cylinder being free from any stresses other than pressure exerted by the conductive liquid. A low frequency AC voltage is then applied between an electrode in contact with the conductive liquid and the internal conductor, and the amplitude of the voltage is increased progressively up to a value such that an electrical field is created having an amplitude greater than a coercive field of polarization Ec of the ferroelectric material.

15 Claims, 2 Drawing Sheets

PROCESS FOR POLARIZING A FERROELECTRIC MATERIAL IN THE SHAPE OF A CYLINDER

BACKGROUND OF THE INVENTION

The invention concerns a process and a device for polarizing at least one part of a cylinder-shaped ferroelectric material.

Most often, besides ceramics, the ferroelectric materials that are polarized are VDPF vinylidene polyfluoride or the copolymer VDPF-TFRE (trifluorethylene). More generally this involves polymers or copolymers.

After having been polarized, these materials have residual polarization and, as a result, have piezoelectric or pyroelectric properties allowing them to be used more particularly in sensors.

Processes and devices are already known for polarizing sheets of ferroelectric material, described by the applicant in the documents FR-2 538 157, FR-2 700 219, FR-2 700 720 and FR 2 270 863. These processes include the following steps:

- an external electrode is placed on each face of the sheet of ferroelectric material to be polarized, so that the area to be polarized occupies the interval between these two electrodes;
- this unit is highly compressed using a press;
- high voltage is applied to the material, according to a predetermined cycle, using electrodes; polarization is then accomplished in the area of coverage between the two electrodes.

Compressing the sheet-electrode unit makes it possible to limit the possible local variations in volume due to the high values of the electrical field during the polarization phase, these variations in volume being likely to cause dielectric breakdowns or to affect the reproducibility of the features of the sensors. In practice, the pressure that can thus be exerted on the sheet of ferroelectric material is around 200 bars.

These processes allow one to obtain a known, predetermined level of polarization and to guarantee homogeneous and reproducible polarization through compression of the sheet-electrode unit. Furthermore, piezoelectric performance levels are much higher than with other processes such as the Corona process, for example.

However, these processes do not allow polarization of ferroelectric materials in non-pellicular form, for example, cylinders. In effect, these processes involve placing the materials undo flat table presses at pressures that can reach several hundreds of bars. Applying these processes to cylindrical-shape components would therefore result in the distortion and crushing of these components. Furthermore, in this way, the polarization process is not accomplished correctly.

SUMMARY OF THE INVENTION

The invention seeks to mitigate or eliminate the limitations of polarization processes known in the state of the art by proposing a solution that makes it possible to apply the polarization process described in the documents cited above to components made of a ferroelectric material with a cylindrical shape.

According to a first aspect, the invention regards a process for polarizing cylinder-shaped ferroelectric material, an internal conductor being placed inside and in the axis of said cylinder.

Since a cylinder possesses rotational symmetry, it is not necessary to place it under stress during the polarization phase to obtain homogeneous and reproducible polarization.

The process according to the invention includes the following steps:

- at least one part of said cylinder is placed in a conductive liquid, said cylinder being free of any stress other than the pressure exerted by the conductive liquid;
- a low frequency, AC voltage is applied between an electrode in contact with the conductive liquid and the internal conductor positioned inside and in the axis of the cylinder, which is increased progressively in amplitude until a value such that the electrical field thus created has an amplitude greater than the coercive field of polarization Ec of said material.

This process can be used more particularly to polarize flexible or stiff ferroelectric cables. After the polarization step, these cables can be covered with a braiding or conductive paint.

This process can also be used to polarize cylinders of ferroelectric polymers or copolymers.

According to one mode of embodiment, several parts of the same very long cylinder can be polarized successively: once the desired polarization is achieved for a first part of the cylinder, said cylinder is moved by pulling on internal conductor in order to remove said first part of the cylinder from the conductive liquid and to immerse a second part of the cylinder in order to polarize said second part.

According to a variant of this mode of embodiment, successive parts or the ferroelectric material in cylinder form an be alternately polarized positively and negatively.

According to another variant, only certain parts of the cylinder of ferroelectric material can be polarized.

According to a second aspect, the invention concerns a device for implementing this process, said device comprising a vessel containing a conductive liquid, an electrode in contact with the conductive liquid, means for inserting the cylinder-shaped ferroelectric material into the conductive liquid and means for applying low frequency AC voltage whose amplitude is increased progressively to a value such that the electrical field thus created has a higher amplitude than the coercive field of polarization Ec of said material between the electrode in contact with the conductive liquid and the internal conductor positioned in the axis of the cylinder.

According to one embodiment, the device also comprises means for rolling up the cylinder of ferroelectric material so that one can, for example, polarize long lengths of flexible ferroelectric cable made of a ferroelectric material in whose axis an internal conductor is positioned.

The process according to the invention may be used, among other uses, to produce an acoustical antenna or a polarized component for a piezoelectric sensor.

As when it is applied to sheets of ferroelectric material, polarization is controlled in level and may be accelerated in time.

BRIEF DESCRIPTION OF THE DRAWINGS

Other features and advantages of this invention will become clear upon reading the following description in reference to the appended drawings in which.

DESCRIPTION OF THE PREFERRED EMBODIMENTS

Figure 1:
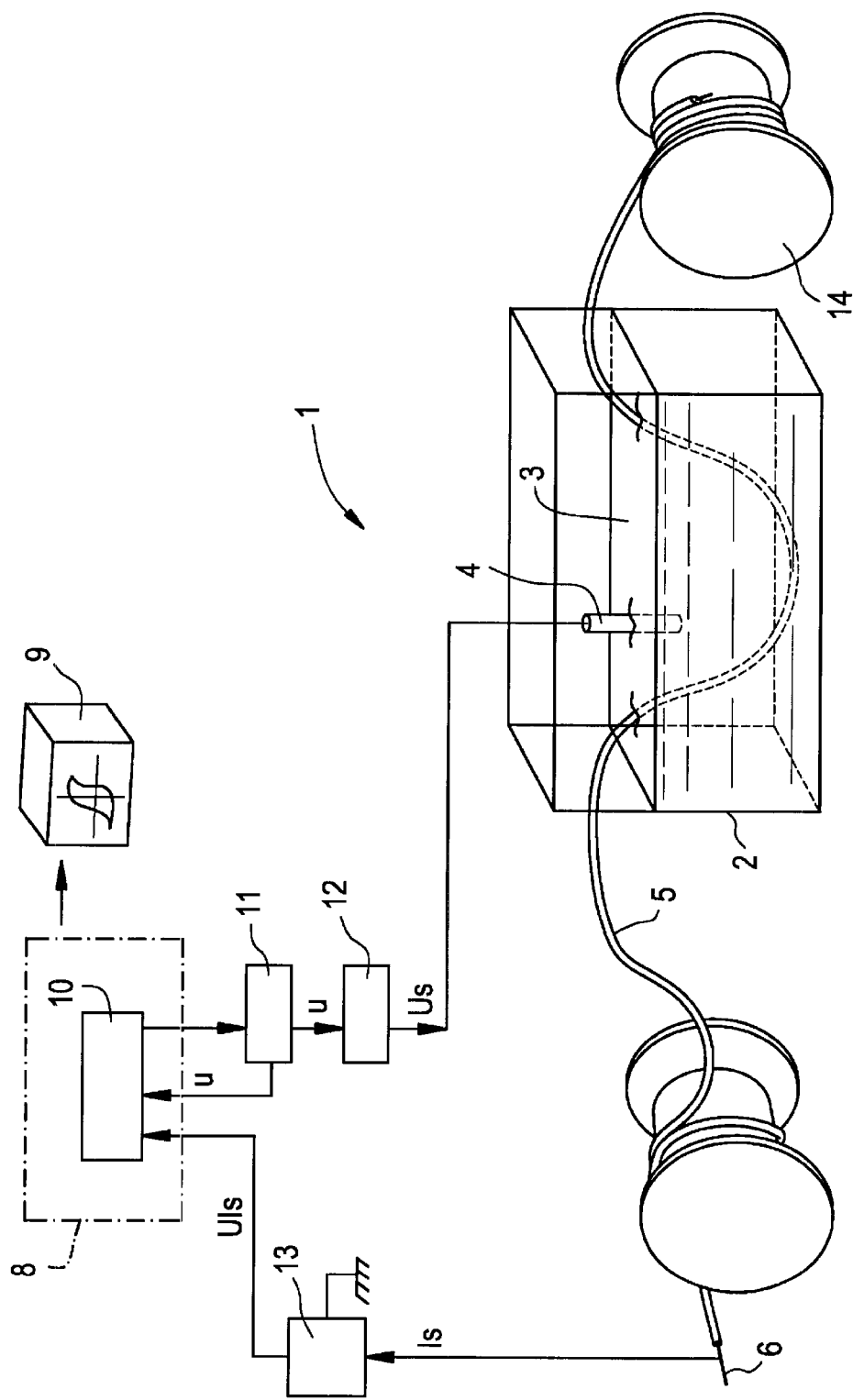
FIG. 1 is a diagram showing a device for implementing the polarization process according to the invention.

FIG. 1 represents a device 1 for polarizing ferroelectric materials in the shape of cylinders.

The ferroelectric materials that can be used are, more particularly, polymers and copolymers among which can be cited, by way of non-limiting examples, VDPF (vinylidene polyfluoride) or VDPF-TFRE (trifluorethylene) copolymers.

First described will be a device that makes it possible to implement the process according to the invention.

Referring to FIG. 1, the device 1 comprises a vessel 2 containing a conductive liquid 3 in which an electrode 4 is immersed. The resistivity of the conductive liquid 3 is around one ohm per $cm^3$.

Figure 2:
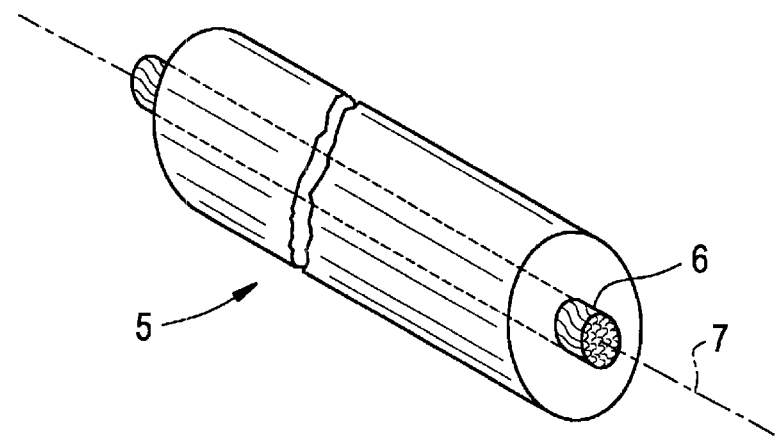
FIG. 2 is a two-dimensional view of part of a cylinder made of ferroelectric material in whose axis an internal conductor is placed.

Means not shown here make it possible to place a cylinder 5 of ferroelectric material that needs to be polarized into said vessel. This cylinder 5, as illustrated in FIG. 2, comprises an internal conductor 6 such as a copper wire, positioned in the axis of 7 and inside said cylinder 5. This conductor 6 is brought to zero earth potential.

A calculator, such as a microcomputer 8 with a display monitor 9, is equipped with a card 10 to control the advancement of the process. The card 10 controls a low frequency generator 11 to cause it to deliver AC voltage U, for example, low frequency sinusoidal voltage, whose amplitude is variable. This voltage U Is transmitted to the input of a high voltage amplifier 12, which applies amplified voltage Us to the electrode 4.

The device also comprises a current/voltage converter 13 preferably mounted on the line connecting the internal conductor 6 to ground to measure the current is travelling through the internal conductor 6 in response to the application of the variable voltage Us.

In one embodiment, the devise 1 comprises means 14 for rolling up the cylinder 5 of ferroelectric material, such as a drum, making it possible to limit the size and to facilitate storage. It is thus possible to polarize very long lengths of cylinder.

The polarization process disclosed by the invention will now be described.

The part of the cylinder 5 of ferroelectric material to be polarized is immersed in the conductive liquid 3, this part of the cylinder 5 being free of any stresses other than the pressure exerted by the liquid 3.

The card 10 then controls the generator 11 to cause it to deliver AC voltage U at a very low frequency and at an amplitude that slowly increases up to a value corresponding, after amplification by the amplifier, to the application to the cylinder 5 of an electrical field superior to the coercive field Ec of the ferroelectric material to be polarized. The maximum value of the amplitude of the corresponding voltage Us is approximately 60 V to 300V per micron of thickness of the ferroelectric material. The maximum value of the amplitude of the voltage Us may, for example, be 30 kV for a cylinder whose ferroelectric material is 300 $\mu$m thick. The frequency of the AC voltage is typically chosen to be less than 1 Hz and preferably in the range of 0.001 Hz–1 Hz. The voltage U is increased progressively. For the example of the copolymer VF2/VF3, the value of the increment is around 2,000 V. However, this value is not critical; a value can be chosen from a range running typically from 100 V to 30,000 V based on the piezoelectric or pyroelectric characteristics to be obtained.

The current/voltage converter 13 measures the current 1s passing through the internal conductor 6 in response to the application of the variable voltage Us. The measurement result is transmitted to the card 10 in the form of a voltage Us signal proportional to the current 1s. The card 10 also receives the voltage signal U proportional to the voltage Us applied to the cylinder 5 of ferroelectric material. The card 10 includes analog/digital converters (not shown) that convert the voltage signals U and Uls into digital signals representing the voltage Us and the current 1s in the ferroelectric material.

These digital signals are then processed by the card 10 in analogous fashion to what is described in the document FR-2 700 219, in order to calculate the value of the polarization P in the ferroelectric material. During the process, the variations in polarization P based on the voltage Us are displayed on the monitor 9 as a hysteresis cycle 15 shown in FIG. 3. The display of this cycle 15 makes it possible to ensure its stabilization at the end of the process.

Figure 3:
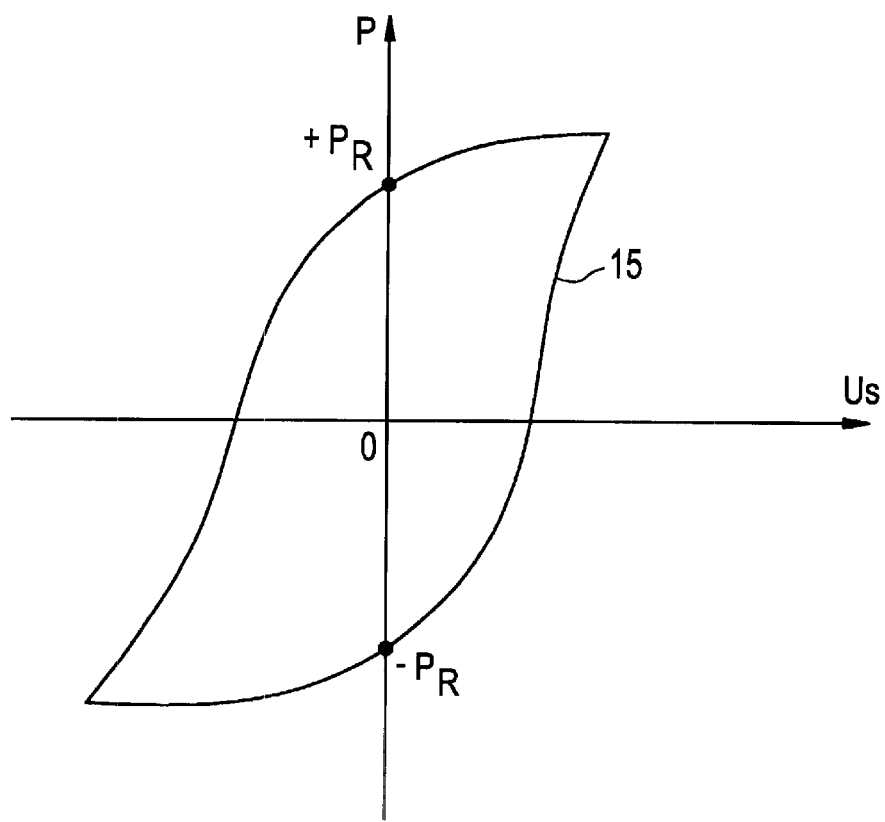
FIG. 3 is a graph representing the hysteresis curve "polarization P"-"Electrical field E" of a polarized ferroelectric material.

Once stabilization has been achieved, the voltage Us is suppressed, and a residual polarization Pr indicated in FIG. 3 then remains in the part of the cylinder 5 immersed in the conductive liquid 3. As a result, on the one hand, of the rotational symmetry presented by the cylinder 5 and, on the other hand, of the application to said cylinder 5 of an electrical field between the internal conductor 6 positioned in the axis 7 of said cylinder 5 and the conductive liquid 3 in which said cylinder is immersed, the residual polarization of the ferroelectric material in the shape of a cylinder is radial.

The length of immersion of the cylinder 5 in the conductive liquid 3 is a function of the level of polarization to be achieved. Of course, the polarization process according to the invention is carried out at a temperature lower than the Curie point of the ferroelectric material under consideration.

The hydrostatic sensitivity measurements taken under the same conditions on samples polarized by the Corona effect and by the process according to the invention show that the performance levels obtained using the process according to the invention are two to three times higher than those obtained using the Corona process as shown in the following table.

| Description of the cable samples | Hydrostatic sensitivity $d_{3h}$ (pC.N$^{-1}$) | Comments |
| --- | --- | --- |
| A: polarized using the process according to the invention | 7.74 | Reverse polarity from that of samples B and C |
| B: polarized using the process according to the invention | 7.17 | |
| C: polarized using the process according to the invention | 9.24 | |
| D: polarized using the Corona process by ORMAL | 3.13 | Identical polarity to that of samples B and C |

The process according to the invention may also comprise a drying step for the cylinder-shaped ferroelectric material after removing said material from the conductive liquid 3.

One embodiment provides for polarizing different parts of the cylinder-shaped ferroelectric material independently of one another, so that different levels of polarization can be obtained along the length of the cylinder 5. To this end, once the desired level of polarization has been reached for a first part of said material, the invention provides for moving the cylinder 5 by pulling on the internal conductor 6 in order to remove the part of the cylinder 5 that has just been polarized from the conductive liquid 3 and to immerse another part of the cylinder 5 in order to polarize it.

Thus, according to a first variant of this embodiment, successive parts of the cylinder 5 can have polarizations of the same sign at different levels. To accomplish this, it suffices to define for each of the parts of the cylinder 5 the level of polarization desired and to determine the value of the maximum amplitude of the corresponding voltage U.

A first part of the cylinder 5 of ferroelectric material to be polarized is immersed in the conductive liquid 3 and the maximum amplitude of the voltage U that will bring it to the desired level of polarization for this first part is set. The process takes place as previously. Once the hysteresis cycle 15 has stabilized, the voltage Us is discontinued and the first part of the cylinder 5 has the pre-determined level of polarization.

By pulling on the internal conductor 6, the cylinder 5 is moved to immerse a second part of said cylinder 5. The maximum amplitude of U corresponding to the desired level of polarization for this second part is set and the process is repeated. The process is identical for the successive parts of the cylinder 5 of ferroelectric material to be polarized.

According o a second variant, the process according to the invention allows polarization of ferroelectric material in cylinder form according to alternate sequences so that along its axis, cylinder 5 has parts that are alternately polarized positively and negatively. The sign of the residual polarization of the ferroelectric material depends on the direction of variation of the voltage U immediately before it is discontinued. Thus, as the hysteresis 15 shows, discontinuing the voltage U by decreasing it results in a positive value of residual polarization, while discontinuing of the voltage U by increasing it from a negative value results in a negative value of residual polarization.

According to a third variant, only certain parts of the cylinder 5 can be polarized. To this end, the parts of the cylinder 5 of ferroelectric material that are not to be polarized are either immersed in the conductive liquid 3, but not subjected to the high voltage, or are not immersed in the conductive liquid 3.

Of course, it is possible to combine the three variants described previously in order to obtain the desired polarization for each part of the cylinder 5 of ferroelectric material.

The process according to the invention is used more particularly to polarize ferroelectric cables comprising a ferroelectric material placed around an internal conductor 6, particularly to polarize flexible ferroelectric cables. Once the desired polarization has been achieved for the cable, it can be covered with braiding or with conductive paint. The diameter of the cable is preferably between several tenths of a micron and 1 mm.

The process according to the invention is also applicable for producing polarized components for piezoelectric sensors. In particular, the fact of polarizing only certain parts of the ferroelectric material in the shape of a cylinder makes it possible to produce sequenced binary piezoelectric/pyroelectric-non piezoelectric/pyroelectric sensors.

This invention is also applicable to producing acoustic antennas or intrusion detectors.

What is claimed is:

1. Process for polarizing at least a part of a ferroelectric material in the cylindrical shape having a longitudinal axis, and having an internal conductor inside the cylinder disposed along the longitudinal axis, comprising the steps of:
    placing at least part of said cylinder in a conductive liquid, said cylinder being free from any stresses other than pressure exerted by the conductive liquid; and
    applying a low frequency AC voltage between an electrode in contact with the conductive liquid and the internal conductor, and increasing the amplitude of said voltage progressively up to a value such that an electrical field is created having an amplitude greater than a coercive field of polarization Ec of said ferroelectric material.

2. Process according to claim 1, wherein the material is a ferroelectric cable.

3. Process according to claim 1, wherein the material is a polymer or a copolymer.

4. Process according to claim 1, wherein the conductive liquid has a resistivity of about one ohm per cm$^3$.

5. Process according to claim 1, wherein the AC voltage has a frequency of between 0.001 Hz and 1 Hz.

6. Process according to claim 1, wherein the voltage applied has a maximum amplitude of about 60 V to 300 V per micron of thickness of said ferroelectric material.

7. Process according to claim 1, wherein the material is a cable having a thickness of ferroelectric material of between a few tenths of a micron and 1 mm.

8. Process according to claim 1, wherein a first portion of the cylinder is polarized,
    additionally comprising moving said cylinder by pulling on the internal conductor, in order to remove the first portion of the cylinder from the conductive liquid and to immerse a second portion of the cylinder in the conductive liquid, and polarizing said second portion of the cylinder by applying a low frequency AC voltage between an electrode in contact with the conductive liquid and the internal conductor, and increasing the amplitude of said voltage progressively up to a value such that an electrical field is created having an amplitude greater than a coercive field of polarization Ec of said ferroelectric material.

9. Process according to claim 8, wherein successively portions of the cylinder are alternately polarized positively and negatively.

10. Process according to claim 1, wherein at least a potion of the cylinder is not polarized.

11. Process according to claim 2, additionally comprising covering the cable with braiding or with conductive paint after polarization.

12. Process according to claim 1, wherein the polarized ferroelectric material is an acoustic antenna.

13. Process according to claim 1, wherein the polarized ferroelectric material is a polarized component for a piezoelectric sensor.

14. Apparatus for polarizing a ferroelectric material in the shape of a cylinder having a longitudinal axis, said ferroelectric material having an internal conductor disposed along the longitudinal axis thereof, comprising:
   a vessel containing a conductive liquid;
   an electrode in contact with the conductive liquid,
   means for inserting at least a portion of the ferroelectric material in the shape of a cylinder into the conductive liquid;
   means for applying low frequency AC voltage between the electrode in contact with the conductive liquid and the internal conductor disposed along the longitudinal axis; and
   means for increasing amplitude of the AC voltage progressively up to a value such that an electrical field thereby created has a higher amplitude than a coercive field of polarization Ec of said ferroelectric material.

15. Apparatus according to claim 14, additionally comprising drum means for rolling up the cylinder of ferroelectric material after polarization thereof.

* * * * *